United States Patent
Lee et al.

(10) Patent No.: US 9,268,065 B1
(45) Date of Patent: *Feb. 23, 2016

(54) COMPOSITION FOR POLARIZING FILM, POLARIZING FILM, AND DISPLAY DEVICE INCLUDING THE POLARIZING FILM

(71) Applicants: SAMSUNG ELECTRONICS CO., LTD., Suwon-si, Gyeonggi-do (KR); SAMSUNG SDI CO., LTD., Giheung-gu, Yongin-si (KR)

(72) Inventors: Yong Joo Lee, Suwon-si (KR); Ha Na Kim, Yongin-si (KR); Deuk Kyu Moon, Seoul (KR); Jong Hoon Won, Yongin-si (KR); Myung Sup Jung, Seongnam-si (KR)

(73) Assignees: SAMSUNG ELECTRONICS CO., LTD. (KR); SAMSUNG SDI CO., LTD. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/644,404

(22) Filed: Mar. 11, 2015

(30) Foreign Application Priority Data

Oct. 27, 2014 (KR) .................... 10-2014-0146394

(51) Int. Cl.
| | |
|---|---|
| *F21V 9/14* | (2006.01) |
| *G02B 5/30* | (2006.01) |
| *G02C 7/12* | (2006.01) |
| *G02B 1/08* | (2006.01) |
| *B29D 7/01* | (2006.01) |
| *G02F 1/1335* | (2006.01) |

(52) U.S. Cl.
CPC ............... *G02B 1/08* (2013.01); *G02B 5/3025* (2013.01)

(58) Field of Classification Search
USPC ............. 252/585; 264/1.34; 349/96; 428/220
See application file for complete search history.

(56) References Cited

U.S. PATENT DOCUMENTS

| 7,442,475 B2 | 10/2008 | Farrand et al. |
| 2013/0092874 A1 | 4/2013 | Bacher et al. |
| 2013/0303677 A1* | 11/2013 | Kim ..................... G02B 5/3016 |
| | | 524/508 |
| 2014/0124714 A1 | 5/2014 | Lee et al. |
| 2014/0131643 A1 | 5/2014 | Lee et al. |

FOREIGN PATENT DOCUMENTS

| FR | WO 2011/157614 A1 * | 12/2011 |
| GB | 2396154 A | 6/2004 |
| JP | 2006523184 A | 10/2006 |
| KR | 1020130125325 A | 11/2013 |
| KR | 1020140059145 A | 5/2014 |
| WO | 2011157614 A1 | 12/2011 |

* cited by examiner

*Primary Examiner* — Bijan Ahvazi
(74) *Attorney, Agent, or Firm* — Cantor Colburn LLP

(57) ABSTRACT

A composition for a polarizing film, including a polyolefin and a dichroic dye represented by Chemical Formula 1:

Chemical Formula 1

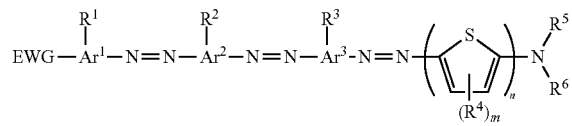

wherein in Chemical Formula 1, groups and variables are the same as defined in the detailed description.

21 Claims, 5 Drawing Sheets

COMPOSITION FOR POLARIZING FILM, POLARIZING FILM, AND DISPLAY DEVICE INCLUDING THE POLARIZING FILM

CROSS-REFERENCE TO RELATED APPLICATION

This application claims priority to Korean Patent Application No. 10-2014-0146394, filed in the Korean Intellectual Property Office on Oct. 27, 2014, and all the benefits accruing therefrom under 35 U.S.C. §119, the content of which is incorporated herein in its entirety by reference.

BACKGROUND

1. Field

A composition for a polarizing film, a polarizing film, and a display device including the polarizing film are disclosed.

2. Description of the Related Art

A display device such as a liquid crystal display (LCD) and an organic light emitting diode (OLED) includes a polarizing plate attached to the outside of a display panel. The polarizing plate only transmits light of a specific wavelength and absorbs or reflects light of any other wavelength, thus controlling the direction of incident light on the display panel or light emitted from the display panel.

The polarizing plate generally includes a polarizer and a protective layer for the polarizer. The polarizer may be formed of, for example, polyvinyl alcohol (PVA), and the protective layer may be formed of, for example, triacetyl cellulose (TAC).

However, the process of fabrication of the polarizing plate including the polarizer and the protective layer is not only complicated and expensive, but also results in a production of a thick polarizing plate which leads to an increased thickness of a display device. Accordingly, there remains a need in a polarizing film that does not require a protective layer.

SUMMARY

An embodiment provides a composition for a polarizing film that may improve polarization characteristics and absorption of light in a long wavelength region, and a polarizing film manufactured from the composition.

Another embodiment provides a display device including the polarizing film.

According to an embodiment, a composition for a polarizing film including a polyolefin and a dichroic dye represented by Chemical Formula 1 is provided.

Chemical Formula 1

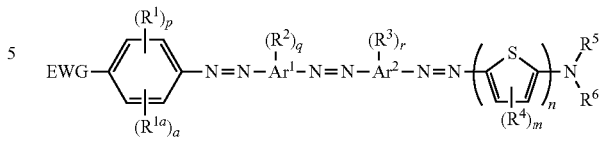

In Chemical Formula 1,

EWG is an electron withdrawing group, $Ar^1$ is a C6 to C12 arylene group or a C4 to C12 heteroarylene group, $Ar^2$ is a C12 to C20 arylene group or a C4 to C20 heteroarylene group, $R^1$ and $R^2$ are independently hydrogen, a substituted or unsubstituted C1 to C30 alkyl group, a substituted or unsubstituted C1 to C20 alkoxy group, a substituted or unsubstituted C1 to C20 alkylthio group, a substituted or unsubstituted C2 to C20 alkenyl group, or a substituted or unsubstituted C2 to C20 alkynyl group, provided that at least one of $R^1$ and $R^2$ is a substituted or unsubstituted C1 to C30 alkyl group, a substituted or unsubstituted C1 to C20 alkoxy group, a substituted or unsubstituted C1 to C20 alkylthio group, a substituted or unsubstituted C2 to C20 alkenyl group, or a substituted or unsubstituted C2 to C20 alkynyl group, $R^3$ and $R^4$ are independently hydrogen, a substituted or unsubstituted C1 to C30 alkyl group, a substituted or unsubstituted C1 to C20 alkoxy group, or a substituted or unsubstituted C1 to C20 alkylthio group, m and n are integers of 1 or 2, $R^{1a}$ is hydrogen or a substituted or unsubstituted C1 to C30 alkyl group, provided that a+p, q, and r do not exceed bonding valence of the phenylene group, $Ar^1$ and $Ar^2$, respectively, and $R^5$ and $R^6$ are independently hydrogen, a substituted or unsubstituted C1 to C10 alkyl group, wherein $R^5$ and $R^6$ are optionally linked to each other to provide a ring.

The $R^1$ and $R^2$ may independently be a substituted or unsubstituted C5 to C30 alkyl group, a substituted or unsubstituted C5 to C20 alkoxy group, a substituted or unsubstituted C5 to C20 alkylthio group, a substituted or unsubstituted C5 to C20 alkenyl group, or a substituted or unsubstituted C5 to C20 alkynyl group.

The $Ar^1$ may be a phenylene group or a naphthylene group.

The $Ar^2$ may be a naphthylene group or an anthracenylene group.

The EWG may be a halogen, $C(=O)R$, $C(=O)OR'$, a haloalkyl group, $C(=O)Cl$, CN, $SO_3R''$, or $NO_2$. Herein R, R', and R'' are a C1 to C30 alkyl group, for example, a C5 to C30 alkyl group, and the haloalkyl group may be a C1 to C30 haloalkyl group, for example, a C5 to C30 haloalkyl group.

The dichroic dye represented by Chemical Formula 1 may include a dichroic dye represented by Chemical Formula 2.

Chemical Formula 2

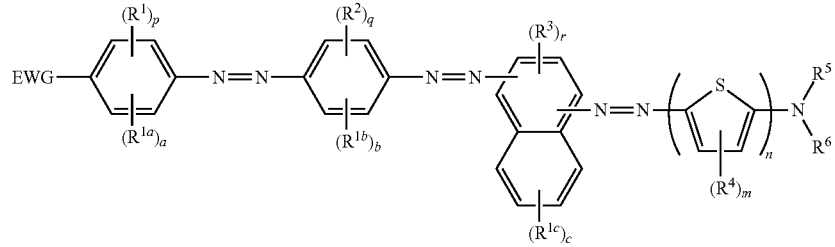

In Chemical Formula 2,

EWG is an electron withdrawing group, $R^1$ and $R^2$ are independently hydrogen, a substituted or unsubstituted C1 to C30 alkyl group, a substituted or unsubstituted C1 to C20 alkoxy group, a substituted or unsubstituted C1 to C20 alkylthio group, a substituted or unsubstituted C2 to C20 alkenyl group, or a substituted or unsubstituted C2 to C20 alkynyl group, provided that at least one of $R^1$ and $R^2$ is a substituted or unsubstituted C1 to C30 alkyl group, a substituted or unsubstituted C1 to C20 alkoxy group, a substituted or unsubstituted C1 to C20 alkylthio group, a substituted or unsubstituted C2 to C20 alkenyl group, or a substituted or unsubstituted C2 to C20 alkynyl group, $R^3$ and $R^4$ are independently hydrogen, a substituted or unsubstituted C1 to C30 alkyl group, a substituted or unsubstituted C1 to C20 alkoxy group, or a substituted or unsubstituted C1 to C20 alkylthio group, m and n are integers of 1 or 2, $R^{1a}$ to $R^{1c}$ are independently hydrogen, or a substituted or unsubstituted C1 to C30 alkyl group, p, q, r, a, b, and c are integers of 0 to 2, respectively, provided that a+p, q+b do not exceed bonding valence of the corresponding phenylene group, and r+c does not exceed bonding valence of the naphthylene group, and $R^5$ and $R^6$ are independently hydrogen, a substituted or unsubstituted C1 to C10 alkyl group, wherein $R^5$ and $R^6$ are optionally linked to each other to provide a ring.

The $R^1$ and $R^2$ may be a substituted or unsubstituted C5 to C30 alkyl group, a substituted or unsubstituted C5 to C20 alkoxy group, a substituted or unsubstituted C5 to C20 alkylthio group, a substituted or unsubstituted C5 to C20 alkenyl group, or a substituted or unsubstituted C5 to C20 alkynyl group.

The dichroic dye may have a decomposition temperature of greater than or equal to about 245° C.

The polyolefin may have a melting point of less than or equal to about 300° C.

The polyolefin may include polyethylene, polypropylene, a copolymer thereof, or a combination thereof.

The polyolefin may have a melt flow index of about 1 gram per 10 minutes to about 15 grams per 10 minutes.

The polyolefin may be a mixture of polypropylene and a polyethylene-polypropylene copolymer, the polypropylene may have a melt flow index of about 0.1 grams per 10 minutes to about 5 grams per 10 minutes, and the polyethylene-polypropylene copolymer may have a melt flow index of about 5 grams per 10 minutes to about 15 grams per 10 minutes.

The polyolefin may be a mixture of polypropylene and a polyethylene-polypropylene copolymer, and the polyethylene-polypropylene copolymer may include about 1 to about 50 percent by weight of polyethylene.

The polyolefin may include the polypropylene and the polyethylene-polypropylene copolymer in a weight ratio of about 1:9 to about 9:1.

An amount of the dichroic dye may be about 0.01 to about 5 parts by weight based on 100 parts by weight of the polyolefin.

An amount of the dichroic dye may be about 0.05 to 1 part by weight based on 100 parts by weight of the polyolefin.

The composition for a polarizing film may have a solid content of greater than or equal to about 90 percent by weight.

The composition for a polarizing film may not include a solvent.

According to another embodiment, a polarizing film including a molten mixture of the composition for a polarizing film is provided.

The polarizing film may have a dichroic ratio of about 3 to about 10 in a wavelength region of greater than or equal to about 600 nanometers.

The dichroic dye may be dispersed in the polyolefin, and the polyolefin may be elongated in a uniaxial direction at an elongation rate of about 400 to about 1,000%.

According to another embodiment, a display device including the polarizing film is provided.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
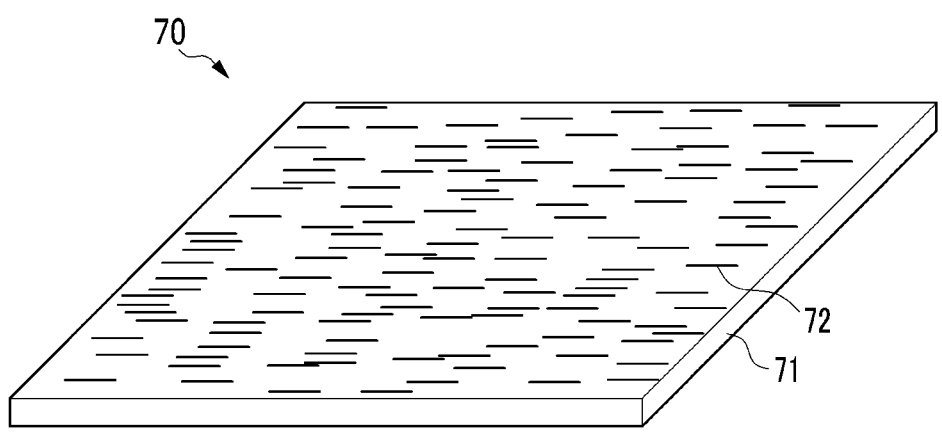
FIG. 1 is a schematic view showing a polarizing film according to an embodiment.

Exemplary embodiments will hereinafter be described in detail, and may be easily performed by those who have common knowledge in the related art. However, this disclosure may be embodied in many different forms and is not to be construed as limited to the exemplary embodiments set forth herein; rather, these embodiments are provided so that this disclosure will fully convey the scope of the disclosure to those skilled in the art. Thus, in some exemplary embodiments, well known technologies are not specifically explained to avoid ambiguous understanding of the present inventive concept. Accordingly, the exemplary embodiments are merely described below, by referring to the figures, to explain aspects of the present inventive concept. Expressions such as "at least one of," when preceding a list of elements, modify the entire list of elements and do not modify the individual elements of the list. Unless otherwise defined, all terms used in the specification (including technical and scientific terms) may be used with meanings commonly understood by a person having ordinary knowledge in the art to which this invention belongs. Further, unless explicitly defined to the contrary, the terms defined in a generally-used dictionary should be interpreted as having a meaning that is consistent with their meaning in the context of the relevant art and the present disclosure, and are not ideally or excessively interpreted. In addition, unless explicitly described to the contrary, the word "comprise" and variations such as "comprises" or "comprising", and the word "include" and variations such as "includes" or "including", when used in this specification, specify the presence of stated features, regions, integers, steps, operations, elements, and/or components, but do not preclude the presence or addition of one or more other features, regions, integers, steps, operations, elements, components, and/or groups thereof. Therefore, the above words will be understood to imply the inclusion of stated elements but not the exclusion of any other elements.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As stated above, unless specifically described to the contrary, a singular form includes a plural form.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, the term "substituted" refers to one substituted with at least one substituent selected from a C1 to C20 alkyl group, a C1 to C20 aryl group, a C2 to C20 alkenyl group, a C2 to C20 alkynyl group, and a combination thereof, instead of hydrogen of a functional group or a compound.

As used herein, when a definition is not otherwise provided, the term "hetero" refers to one including 1 to 3 heteroatoms selected from N, O, S, and P.

As used herein, when a definition is not otherwise provided, the term "alkyl group" may refer to a group derived from a straight or branched chain saturated aliphatic hydrocarbon having the specified number of carbon atoms and having a valence of at least one.

As used herein, when a definition is not otherwise provided, the term "alkoxy group" may refer to "alkyl-O-", wherein the term "alkyl" has the same meaning as described above.

As used herein, when a definition is not otherwise provided, the term "alkylthio group" may refer to "alkyl-S-", wherein the term "alkyl" has the same meaning as described above.

As used herein, when a definition is not otherwise provided, the term "alkenyl group" may refer to a straight or branched chain, monovalent hydrocarbon group having at least one carbon-carbon double bond.

As used herein, when a definition is not otherwise provided, the term "alkynyl group" may refer to a straight or branched chain, monovalent hydrocarbon group having at least one carbon-carbon triple bond.

As used herein, when a definition is not otherwise provided, the term "cycloalkyl group" may refer to a monovalent group having one or more saturated rings in which all ring members are carbon.

As used herein, when a definition is not otherwise provided, the term "aryl", which is used alone or in combination, may refer to an aromatic hydrocarbon containing at least one ring and having the specified number of carbon atoms. The term "aryl" may be construed as including a group with an aromatic ring fused to at least one cycloalkyl ring.

As used herein, when a definition is not otherwise provided, the term "heteroaryl group" may refer to an aryl group including carbon and 1 to 3 heteroatoms selected from the group consisting of N, O, S, and P as ring atoms.

As used herein, when a definition is not otherwise provided, the term "arylene group" may refer to a functional group having a valence of at least two obtained by removal of two hydrogens in an aromatic ring, optionally substituted with one or more substituents where indicated, provided that the valence of the alkylene group is not exceeded.

As used herein, when a definition is not otherwise provided, the term "heteroarylene group" may refer to a functional group having a valence of at least two obtained by removal of two hydrogens in an aromatic ring, containing one to three heteroatoms selected from the group consisting of N, O, S, Si, and P as ring-forming elements, optionally substituted with one or more substituents where indicated, provided that the valence of the alkylene group is not exceeded.

As used herein, the alkyl group, alkylthio group, alkenyl group, and alkynyl group may be branched or linear.

Hereinafter, a composition for a polarizing film according to an embodiment is described.

The composition for a polarizing film includes a polyolefin and a dichroic dye represented by the following Chemical Formula 1.

Chemical Formula 1

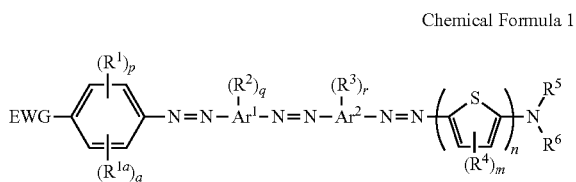

In Chemical Formula 1,

EWG is an electron withdrawing group bonded at a para position from an azo group, $Ar^1$ is a C6 to C12 arylene group or a C4 to C12 heteroarylene group, $Ar^2$ is a C12 to C20 arylene group or a C4 to C20 heteroarylene group, $R^1$ and $R^2$ are independently hydrogen, a substituted or unsubstituted C1 to C30 alkyl group, a substituted or unsubstituted C1 to C20 alkoxy group, a substituted or unsubstituted C1 to C20 alkylthio group, a substituted or unsubstituted C2 to C20 alkenyl group, or a substituted or unsubstituted C2 to C20 alkynyl group, provided that at least one of $R^1$ and $R^2$ is a substituted or unsubstituted C1 to C30 alkyl group, a substituted or unsubstituted C1 to C20 alkoxy group, a substituted or unsubstituted C1 to C20 alkylthio group, a substituted or unsubstituted C2 to C20 alkenyl group, or a substituted or unsubstituted C2 to C20 alkynyl group, $R^3$ and $R^4$ are independently hydrogen, a substituted or unsubstituted C1 to C30 alkyl group, a substituted or unsubstituted C1 to C20 alkoxy group, or a substituted or unsubstituted C1 to C20 alkylthio group, m and n are integers of 1 or 2, $R^{1a}$ is hydrogen or a substituted or unsubstituted C1 to C30 alkyl group, provided that a+p, q, and r do not exceed bonding valence of the phenylene group, $Ar^1$ and $Ar^2$, respectively, for example p, q, and r may be integers of 1 or 2, respectively, and a, b, and c may be integers of 0 to 2, respectively, and $R^5$ and $R^6$ are independently hydrogen, a substituted or unsubstituted C1 to C10 alkyl group, wherein $R^5$ and $R^6$ are optionally linked to each other to provide a ring.

The $R^5$ and $R^6$ may be linked to each other to provide a 5-membered to 8-membered N-containing cycloalkyl group.

Herein, the term "substituted" refers to a group substituted with a substituent selected from a C1 to C20 alkyl group, a C6 to C20 aryl group, a C2 to C20 alkenyl group, a C2 to C20 alkynyl group, and a combination thereof, but not an electron withdrawing group.

The EWG is an electron withdrawing group and is bonded with the phenylene group at the para position from the azo group. When is the EWG is bonded at an ortho or meta position, instead of the para position, the composition for a polarizing film may not have an appropriate dichroic ratio for a long wavelength region of greater than or equal to about 600 nanometers (nm).

Specific examples of the EWG may be a halogen (F, Cl, Br, or I), C(=O)R, C(=O)OR', a haloalkyl group, C(=O)Cl, CN, $SO_3R''$, or $NO_2$. Herein R, R', and R'' are a C1 to C30 alkyl group, for example, a C5 to C30 alkyl group, and the haloalkyl group is a C1 to C30 haloalkyl group, for example, a C5 to C30 haloalkyl group (e.g., a perfluoroalkyl group).

The $R^1$ and $R^2$ are independently substituents substituting for the phenylene group and $Ar^1$, and may be hydrogen, a substituted or unsubstituted C1 to C30 alkyl group, a substituted or unsubstituted C1 to C20 alkoxy group, a substituted or unsubstituted C1 to C20 alkylthio group, a substituted or unsubstituted C2 to C20 alkenyl group, or a substituted or unsubstituted C2 to C20 alkynyl group, provided that at least one of $R^1$ and $R^2$ is a substituted or unsubstituted C1 to C30 alkyl group, a substituted or unsubstituted C1 to C20 alkoxy group, a substituted or unsubstituted C1 to C20 alkylthio group, a substituted or unsubstituted C2 to C20 alkenyl group, or a substituted or unsubstituted C2 to C20 alkynyl group, When such a substituent is present in the phenylene group and the $Ar^1$, the polarizing film may have improved light absorption in a wavelength region of greater than or equal to about 600 nm, and the polarizing film may have an appropriate dichroic ratio for a long wavelength region of greater than or equal to about 600 nm.

When the $R^1$ and $R^2$ are substituents having a long chain such as a substituted or unsubstituted C5 to C30 alkyl group, a substituted or unsubstituted C5 to C20 alkoxy group, a substituted or unsubstituted C5 to C20 alkylthio group, a substituted or unsubstituted C5 to C20 alkenyl group, or a substituted or unsubstituted C5 to C20 alkynyl group, compatibility with the polyolefin may be improved.

When the $Ar^2$ is a polycyclic aromatic ring such as a C12 to C20 arylene group or a C4 to C20 heteroarylene group, the dichroic dye may effectively absorb light in a long wavelength region of greater than or equal to about 600 nm. Particularly, when $Ar^2$ has more rings than the phenylene group or Ar', the dichroic dye may desirably absorb the light in a long wavelength region.

The $Ar^1$ may independently be a phenylene group or a naphthylene group. The $Ar^2$ may be a naphthylene group or an anthracenylene group. For example, $Ar^1$ may be a phenylene group and the $Ar^2$ may be a naphthylene group or an anthracenylene group.

As described above, when the electron withdrawing group (EWG) is bonded at the para position from the azo group, at least one of $R^1$ and $R^2$ substituents is present in the phenylene group and the $Ar^1$, and the polycyclic aromatic group $Ar^2$, the thiophene group, and the amine group ($-NR^5R^6$) are connected sequentially, the dichroic dye may have a structure for effectively absorbing light in the long wavelength region.

The dichroic dye represented by Chemical Formula 1 may include a dichroic dye represented by the following Chemical Formula 2.

Chemical Formula 2

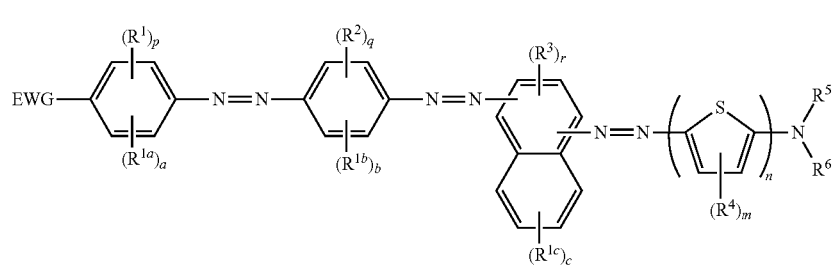

In Chemical Formula 2,

EWG is an electron withdrawing group, $R^1$ and $R^2$ are independently hydrogen, a substituted or unsubstituted C1 to C30 alkyl group, a substituted or unsubstituted C1 to C20 alkoxy group, a substituted or unsubstituted C1 to C20 alkylthio group, a substituted or unsubstituted C2 to C20 alkenyl group, or a substituted or unsubstituted C2 to C20 alkynyl group, provided that at least one of $R^1$ and $R^2$ is a substituted or unsubstituted C1 to C30 alkyl group, a substituted or unsubstituted C1 to C20 alkoxy group, a substituted or unsubstituted C1 to C20 alkylthio group, a substituted or unsubstituted C2 to C20 alkenyl group, or a substituted or unsubstituted C2 to C20 alkynyl group, $R^3$ and $R^4$ are independently hydrogen, a substituted or unsubstituted C1 to C30 alkyl group, a substituted or unsubstituted C1 to C20 alkoxy group, or a substituted or unsubstituted C1 to C20 alkylthio group, m and n are integers of 1 or 2, $R^{1a}$ to $R^{1c}$ are independently hydrogen or a substituted or unsubstituted C1 to C30 alkyl group, p, q, r, a, b, and c are integers of 0 to 2, respectively, provided that a+p, q+b do not exceed bonding valence of the corresponding phenylene group, and r+c does not exceed bonding valence of the naphthylene group, and $R^5$ and $R^6$ are independently hydrogen, a substituted or unsubstituted C1 to C10 alkyl group, wherein $R^5$ and $R^6$ are optionally linked to each other to provide a ring.

The $R^1$ and $R^2$ may independently be a substituted or unsubstituted C5 to C30 alkyl group, a substituted or unsubstituted C5 to C20 alkoxy group, a substituted or unsubstituted C5 to C20 alkylthio group, a substituted or unsubstituted C5 to C20 alkenyl group, or a substituted or unsubstituted C5 to C20 alkynyl group.

Other examples of the dichroic dye may be represented by the following Chemical Formula 3.

Chemical Formula 3

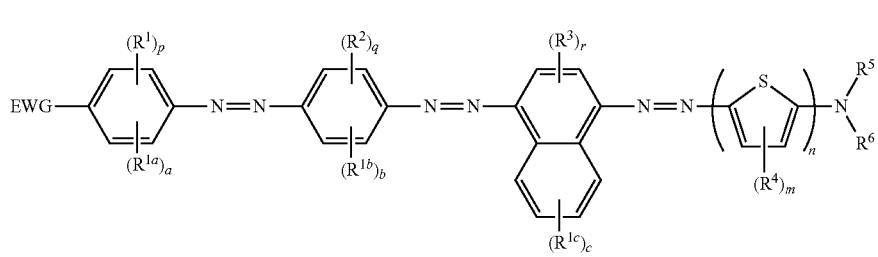

In Chemical Formula 3, each substituent is the same as defined in Chemical Formula 2.

As in Chemical Formula 2 or 3, the naphthylene group as $Ar_2$ of Chemical Formula 1 is linked to two azo groups, so absorption of light in a long wavelength region may be improved.

The dichroic dye of Chemical Formula 1 may be synthesized according to the mechanism shown in the following Reaction Scheme 1.

Reaction Scheme 1

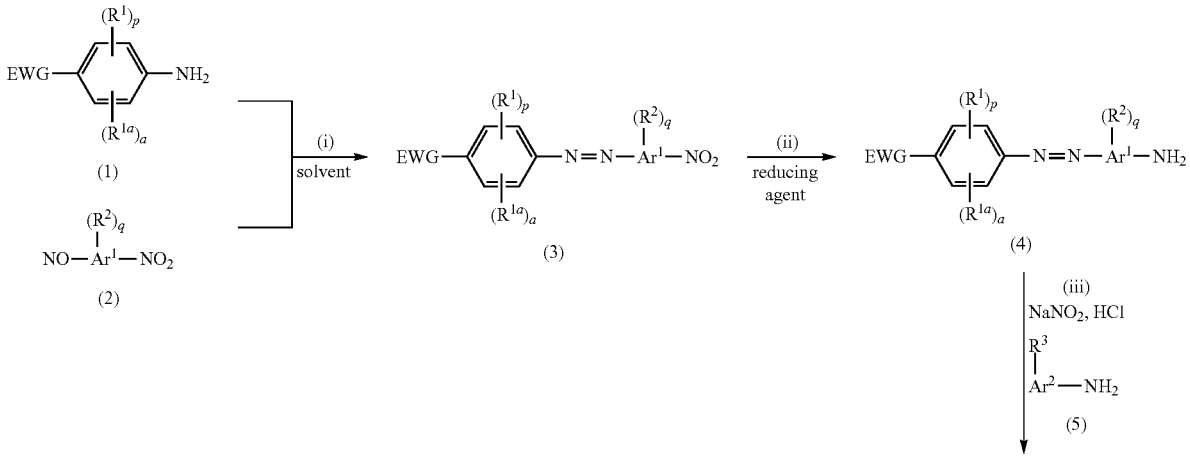

-continued

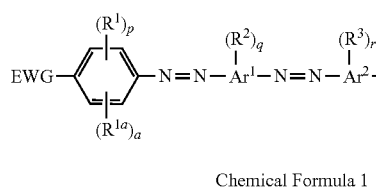

Chemical Formula 1

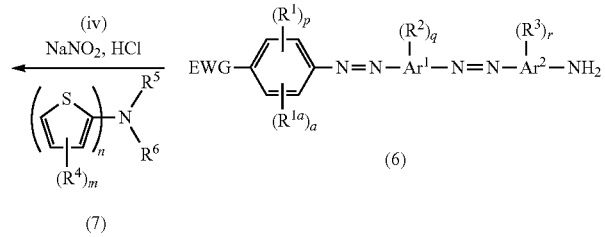

(iv) NaNO₂, HCl (7)

In Reaction Scheme 1, each substituent is the same as defined in Chemical Formula 1.

As shown in Reaction Scheme 1, a first amine compound (1) reacts with a second amine compound (2) to prepare a compound (3). The compound (3) is reduced to prepare a compound (4), and the compound (4) reacts with a third amine compound (5) to prepare a compound (6). The compound (6) reacts with a third amine compound (7) to synthesize the dichroic dye of Chemical Formula 1. In the synthesis steps (iii) and (iv), NaNO₂ is used for introducing a diazonium group, and other reagents besides NaNO₂ may be used without limitation.

The dichroic dye may have a decomposition temperature of greater than or equal to about 245° C. Herein, the decomposition temperature indicates a temperature where the weight of the dichroic dye decreases by about 5% relative to its initial weight. The dichroic dye having such a decomposition temperature may be desirable for a melt-elongation process.

The polyolefin may have a melting point (Tm) of less than or equal to about 300° C.

The polyolefin may be, for example, a mixture of two or more selected from polyethylene (PE), polypropylene (PP), and a polyethylene-polypropylene copolymer (PE-PP).

The polyolefin may be, for example, a mixture of polypropylene (PP) and a polyethylene-polypropylene copolymer (PE-PP).

The polyolefin may have a melt flow index (MFI) of about 1 grams per 10 minutes (g/10 min) to about 15 g/10 min. When the polyolefin has a melt flow index (MFI) within the range, the polyolefin may not only secure excellent light transmittance, since crystals are not excessively formed in the resin, but may also have appropriate viscosity for manufacturing a film and thus have improved workability. For example, the polyolefin may have a melt flow index (MFI) ranging from about 5 g/10 min to about 15 g/10 min.

The polypropylene (PP) may have, for example, a melt flow index (MFI) of about 0.1 g/10 min to about 5 g/10 min. Herein, the melt flow index (MFI) shows the amount of a polymer in a melt state flowing per 10 minutes, and relates to viscosity of the polymer in a melted state. In other words, as the melt flow index (MFI) is lower, the polymer has higher viscosity, while as the melt flow index (MFI) is higher, the polymer has lower viscosity. When the polypropylene (PP) has a melt flow index (MFI) within the range, properties of a final product as well as workability may be effectively improved. For example, the polypropylene (PP) may have a melt flow index (MFI) ranging from about 0.5 g/10 min to about 5 g/10 min.

The polyethylene-polypropylene copolymer (PE-PP) may have a melt flow index (MFI) ranging from about 5 g/10 min to about 15 g/10 min. When the polyethylene-polypropylene copolymer (PE-PP) has a melt flow index (MFI) within the range, properties of a final product as well as workability may be effectively improved. For example, the polyethylene-polypropylene copolymer (PE-PP) may have a melt flow index (MFI) ranging from about 10 g/10 min to about 15 g/10 min.

The polyethylene-polypropylene copolymer (PE-PP) may include about 1 to about 50 percent by weight (wt %) of polyethylene based on the total amount of the copolymer. When the polyethylene-polypropylene copolymer (PE-PP) includes the polyethylene within the range, phase separation of the polypropylene and the polyethylene-polypropylene copolymer (PE-PP) may be effectively prevented or suppressed. In addition, the polyethylene-polypropylene copolymer (PE-PP) may improve an elongation rate during the process of elongation, and may have excellent light transmittance and alignment, thus improving polarization characteristics. For example, the polyethylene-polypropylene copolymer (PE-PP) may include about 1 wt % to about 25 wt % of polyethylene based on the total amount of the copolymer.

The polyolefin may include the polypropylene and the polyethylene-polypropylene copolymer in a weight ratio of about 1:9 to about 9:1. When the polypropylene (PP) and the polyethylene-polypropylene copolymer (PE-PP) are included within the range, the polypropylene may be prevented from crystallizing and may have excellent mechanical strength, thus effectively improving the haze characteristics. For example, the polymer resin may include the polypropylene (PP) and the polyethylene-polypropylene copolymer (PE-PP) in a weight ratio of about 4:6 to about 6:4, for example, in a weight ratio of about 5:5.

The polyolefin may have haze ranging from less than or equal to about 5%. When the polyolefin has haze within the range, transmittance may be increased, and thus excellent optical properties may be secured. For example, the polyolefin may have haze of less than or equal to about 2%, and for another example, about 0.5% to about 2%.

The polyolefin may have crystallinity of less than or equal to about 50%. When the polyolefin has crystallinity within the range, the polyolefin may have lower haze and excellent optical properties. For example, the polyolefin may have crystallinity of about 30% to about 50%.

The polyolefin may be replaced by another resin having similar physical optical properties. For example, the polyolefin may be replaced by a transparent resin having a melting point of greater than or equal to about 130° C. and crystallinity of less than or equal to about 50%, and may be replaced by, for example, a polyester such as polyethylene terephthalate (PET), polyethylene terephthalate glycol (PETG), and polyethylene naphthalate (PEN).

The polyolefin and dichroic dye may be independently present in a solid state such as a powder. The composition for a polarizing film may have, for example, a solid content of greater than or equal to about 90 wt %, and for example, may not include a solvent.

The polyolefin may be mixed with another polymer having similar physical optical properties. For example, the polyolefin may be replaced by a transparent polymer having a melting point of greater than or equal to about 130° C. and crystallinity of less than or equal to about 50%. For example, the polyolefin may be replaced by a polyester such as polyethylene terephthalate (PET), polyethylene terephthalate glycol (PETG), and polyethylene naphthalate (PEN).

According to another embodiment, a polarizing film manufactured by melt-blending and elongating the composition for a polarizing film is provided.

Hereinafter, a polarizing film according to an embodiment is described referring to FIG. 1.

FIG. 1 is a schematic view showing a polarizing film according to an embodiment.

Referring to FIG. 1, a polarizing film 70 according to an embodiment includes a polyolefin 71 and a dichroic dye 72.

The polyolefin 71 is elongated in a uniaxial direction. The uniaxial direction may be same as the length direction of the dichroic dye 72.

The dichroic dye 72 is dispersed into the polyolefin 71 and aligned in the elongation direction of the polyolefin 71. The dichroic dye 72 is a material that transmits one perpendicular polarization component of two perpendicular polarization components in a predetermined wavelength region.

The dichroic dye 72 may be included in an amount of about 0.01 to about 5 parts by weight based on 100 parts by weight of the polyolefin 71. When the dichroic dye is included within the range, sufficient polarization characteristics may be obtained without deteriorating transmittance of a polarizing film. Within the above range, the dichroic dye 72 may be included in an amount of about 0.05 to about 1 part by weight based on 100 parts by weight of the polyolefin 71.

The polarizing film 70 may have a dichroic ratio of greater than or equal to about 3 to about 10 in a wavelength region of greater than or equal to about 600 nm. Herein, the dichroic ratio may be calculated by dividing plane polarization absorbance in a direction perpendicular to the axis of a polymer by polarization absorbance in a horizontal direction according to the following Equation 1.

$$DR = \text{Log}(1/T_\perp)/\text{Log}(1/T_\parallel) \qquad \text{Equation 1}$$

In Equation 1,

DR denotes a dichroic ratio of a polarizing film, $T_\parallel$ is light transmittance of light entering parallel to the transmissive axis of a polarizing film, and $T_\perp$ is light transmittance of light entering perpendicular to the transmissive axis of the polarizing film.

The dichroic ratio shows to what degree the dichroic dye 72 is arranged in the polarizing film 70 in one direction. When the polarizing film 70 has a dichroic ratio within the range in a wavelength region of greater than or equal to about 600 nm, the dichroic dye 72 is arranged according to arrangement of polymer chains, improving polarization characteristics of the polarizing film 70.

The polarizing film 70 may have light transmittance of greater than or equal to about 30%, for example, ranging from about 30% to about 95% within the range. When the polarizing film 70 having light transmittance within the range is applied to one side of a display device, light emitting from the display device may not be prevented.

The polarizing film 70 may be manufactured by melt-blending the composition for a polarizing film and then elongating the same. For example, the polarizing film 70 may be, for example, manufactured by a process including melt-blending the composition for a polarizing film including the polyolefin and the dichroic dye, to prepare a melt-blend, placing the melt-blend into a mold and pressing it into a sheet, and elongating the sheet in a uniaxial direction.

The melt-blending of the composition for a polarization film may be performed at a temperature of less than or equal to about 300° C., for example, from about 50 to about 300° C.

The sheet may be formed by placing the melt blend in the mold, and pressing it with a high pressure or discharging it in a chill roll through a T-die.

The elongation in a uniaxial direction may be performed at a temperature ranging from about 30 to about 200° C. at an elongation rate ranging from about 400% to about 1,000%. The elongation rate refers to a length ratio of after the elongation to before the elongation of the sheet, and signifies the elongation extent of the sheet after uniaxial elongation.

The polarizing film 70 may have a relative low thickness of less than or equal to about 100 micrometers (μm), for example about 30 μm to about 95 μm. When the polarizing film 70 has a thickness within the range, it may be significantly thinner than a polarizing plate requiring a protective layer such as triacetyl cellulose (TAC), and thus may contribute to realizing a thin display device.

The polarizing film 70 may be applied to various display devices.

The display device may be a liquid crystal display (LCD).

Figure 2:
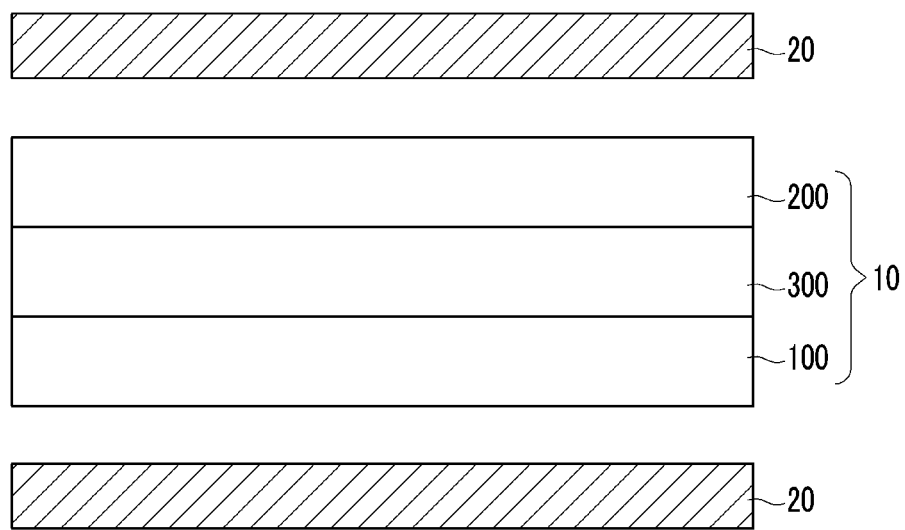
FIG. 2 is a cross-sectional view showing a liquid crystal display (LCD) according to an embodiment.

FIG. 2 is a cross-sectional view showing a liquid crystal display (LCD) according to an embodiment.

Referring to FIG. 2, the liquid crystal display (LCD) includes a liquid crystal display panel 10, and a polarizing film 20 disposed on both the lower part and the upper part of the liquid crystal display panel 10.

The liquid crystal display panel 10 may be a twist nematic (TN) mode panel, a patterned vertical alignment (PVA) mode panel, an in-plane switching (IPS) mode panel, an optically compensated bend (OCB) mode panel, and the like.

The liquid crystal display panel 10 includes a first display plate 100, a second display plate 200, and a liquid crystal layer 300 interposed between the first display plate 100 and the second display plate 200.

The first display plate 100 may include, for example, a thin film transistor (not shown) formed on a substrate (not shown), and a first electric field generating electrode (not shown) connected thereto. The second display plate 200 may include, for example, a color filter (not shown) formed on the substrate and a second electric field generating electrode (not shown). However, it is not limited thereto, and the color filter may be included in the first display plate 100, while both the first electric field generating electrode and the second electric field generating electrode may be disposed in the first display plate 100.

The liquid crystal layer 300 may include a plurality of liquid crystal molecules. The liquid crystal molecules may have positive or negative dielectric anisotropy. When the liquid crystal molecules have positive dielectric anisotropy, the long axis thereof may be aligned substantially parallel to the surface of the first display plate 100 and the second display plate 200 when an electric field is not applied, and may be aligned substantially perpendicular to the surface of the first display plate 100 and the second display plate 200 when an electric field is applied. On the contrary, when the liquid crystal molecules have negative dielectric anisotropy, the long axis thereof may be aligned substantially perpendicular to the surface of the first display plate 100 and the second display plate 200 when an electric field is not applied, and may be aligned substantially parallel to the surface of the first display plate 100 and the second display plate 200 when an electric field is applied.

The polarizing film 20 is disposed on the outside of the liquid crystal display panel 10. Although it is shown to be disposed on the upper part and lower part of the liquid crystal display panel 10 in the drawing, it may be formed on either the upper part or the lower part of the liquid crystal display panel 10.

The polarizing film 20 includes the polyolefin and the dichroic dye represented by Chemical Formula 1 as described above.

The display device may be an organic light emitting diode (OLED) display.

Figure 3:
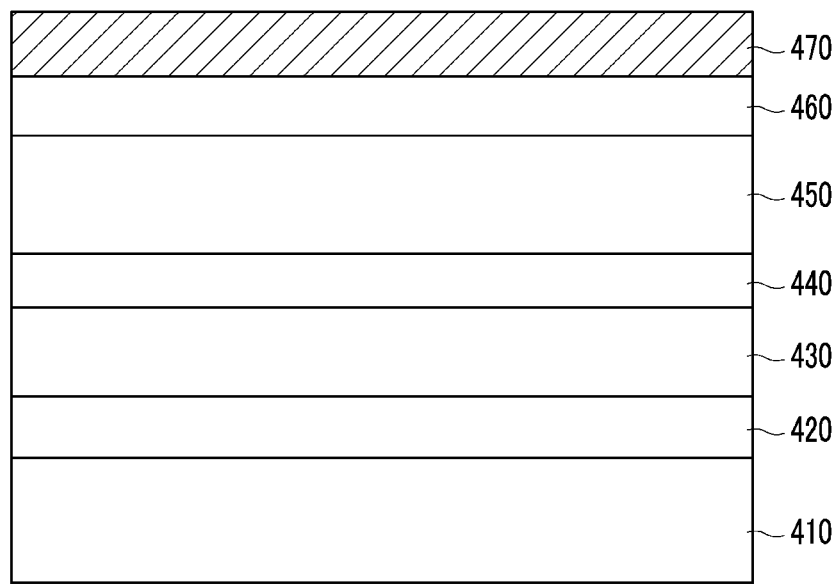
FIG. 3 is a cross-sectional view of an organic light emitting diode (OLED) display according to an embodiment.

FIG. 3 is a cross-sectional view showing an organic light emitting diode (OLED) display according to an embodiment.

Referring to FIG. 3, an organic light emitting diode (OLED) display according to an embodiment includes a base substrate 410, a lower electrode 420, an organic emission layer 430, an upper electrode 440, an encapsulation substrate 450, a phase retardation film 460, and a polarizing film 470.

The base substrate 410 may be formed of glass or plastic.

Either of the lower electrode 420 and the upper electrode 440 may be an anode, while the other is a cathode. The anode is an electrode where holes are injected, and is formed of a transparent conductive material having a high work function and externally transmitting entered light, for example, ITO or IZO. The cathode is an electrode where electrons are injected, is formed of a conducting material having a low work function and having no influence on an organic material, and is selected from, for example, aluminum (Al), calcium (Ca), and barium (Ba).

The organic emission layer 430 includes an organic material emitting light when a voltage is applied between the lower electrode 420 and the upper electrode 440.

An auxiliary layer (not shown) may be included between the lower electrode 420 and the organic emission layer 430 and between the upper electrode 440 and the organic emission layer 430. The auxiliary layer may include a hole transport layer for balancing electrons and holes, a hole injection layer (HIL), an electron injection layer (EIL), and an electron transport layer.

The encapsulation substrate 450 may be made of glass, metal, or a polymer. The lower electrode 420, the organic emission layer 430, and the upper electrode 440 are sealed to prevent moisture and/or oxygen from flowing in.

The phase retardation film 460 may circularly polarize light passing through the polarizing film 470 and generate a phase difference, and thus have an influence on reflection and absorption of the light. The phase retardation film 460 may be omitted depending on a particular embodiment.

The polarizing film 470 may be disposed at a light-emitting side. For example, the polarizing film 470 may be disposed outside of the base substrate 410 in a bottom emission type in which light emits from the base substrate 410, and outside of the encapsulation substrate 450 in a top emission type in which light emits from the encapsulation substrate 450.

The polarizing film 470 may play a role of a light absorption layer absorbing external light and thus prevent display characteristic deterioration due to reflection of the external light.

Hereinafter, the present disclosure is illustrated in more detail with reference to examples. However, these examples are exemplary, and the present disclosure is not limited thereto.

Synthesis of Dichroic Dye

Synthesis Example 1

Synthesis of Compound Represented by Chemical Formula 1a

Chemical Formula 1a

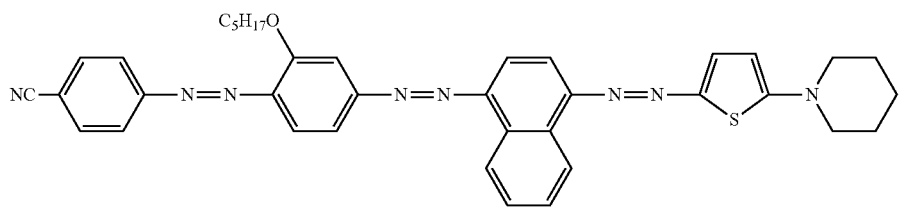

1-1. Synthesis of Monoazo Compound 10 g (37.3 mmol) of 4-((2-hydroxy-4-nitrophenyl)diazenyl)benzonitrile is dissolved in 200 mL of acetone, and 7.8 mL (44.9 mmol) of 1-bromooctane and 10.3 g (74.5 mmol) of potassium carbonate ($K_2CO_3$) are added thereto. Subsequently, the resultant reaction mixture is agitated at 60° C. for 24 hours while being refluxed, and then the temperature is lowered to room temperature. The reaction mixture is concentrated, dissolved in dichloromethane ($CH_2Cl_2$), passes through a silica gel pad, and the filtrated solution is recrystallized using dichloromethane ($CH_2Cl_2$) and n-hexane. The purified compound is dissolved in 150 mL of hot ethanol, and 12.5 g (74.4 mmol) of $Na_2S.5H_2O$ dissolved in hot ethanol and water is added thereto. Subsequently the resultant reaction mixture is agitated at 80° C. for 5 hours, and then the temperature is lowered to room temperature. The resultant precipitated crystal is filtered, washed with water several times, and dried, thus obtaining 8.9 g (25.4 mmol) of 4-((4-amino-2-(octyloxy)phenyl)diazenyl)benzonitrile of the following Chemical Formula 1a-1. A yield is 68%.

Chemical Formula 1a-1

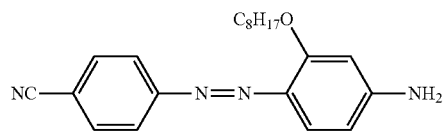

The structure of the 4-((4-amino-2-(octyloxy)phenyl)diazenyl)benzonitrile represented by Chemical Formula 1a-1 is analyzed by $^1$H NMR.

The $^1$H NMR analysis result is as follows.

$^1$H NMR (300 MHz, $CDCl_3$) (ppm): 0.84 (t, J=6.8 Hz, 3H, $CH_3$), 1.21-1.34 (m, 8H, $CH_2 \times 4$), 1.41-1.49 (m, 2H, $CH_2$), 1.79-1.86 (m, 2H, $CH_2$), 4.14 (t, J=6.5 Hz, 2H, $OCH_2$), 4.21 (brs, 2H, $NH_2$), 6.69-7.85 (m, 7H, ArH).

1-2. Synthesis of Bisazo Compound 7.0 g (20.0 mmol) of the 4-((4-amino-2-(octyloxy)phenyl)diazenyl)benzonitrile of Chemical Formula 1a-1 is dissolved in 200 mL of dimethyl acetamide (DMAc), 100 mL of acetic acid (AcOH), and 6.5 mL of 12 N HCl, and the resultant is maintained at 0° C. Subsequently, 1.4 g (20.3 mmol) of sodium nitrate ($NaNO_2$) is dissolved in water, and the solution is slowly added to the reaction mixture dropwise. When the dropwise addition is complete, the reactant is maintained at 0° C. and agitated for one hour. Then, 2.9 g (20.3 mmol) of 1-naphthylamine is dissolved in methanol, the mixture is slowly dropwise added to the reaction mixture, and the mixture is agitated at 0° C. for one hour. Subsequently, the reactant is neutralized by using a sodium hydroxide (NaOH) aqueous solution to complete the reaction, and a solid precipitated therein is filtered. The mixture is purified through silica gel column chromatography (n-hexane:EtOAc=3:1), obtaining 7.9 g (15.7 mmol) of 4-((4-((4-aminonaphthalen-1-yl)diazenyl)-2-(octyloxy)phenyl)diazenyl)benzonitrile represented by the following Chemical Formula 1a-2. A yield is 79%.

Chemical Formula 1a-2

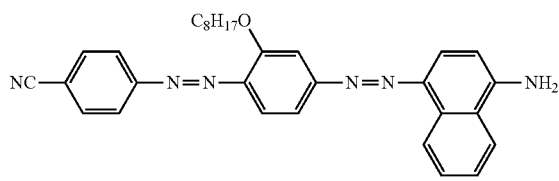

The structure of the 4-((4-((4-aminonaphthalen-1-yl)diazenyl)-2-(octyloxy)phenyl)diazenyl)benzonitrile represented by Chemical Formula 1a-2 is analyzed by $^1$H NMR.

The $^1$H NMR analysis result is as follows.

$^1$H NMR (300 MHz, $CDCl_3$) (ppm): 0.88 (t, J=6.8 Hz, 3H, $CH_3$), 1.23-1.46 (m, 8H, $CH_2\times4$), 1.55-1.59 (m, 2H, $CH_2$), 1.96-2.03 (m, 2H, $CH_2$), 4.16 (t, J=6.5 Hz, 2H, $OCH_2$), 4.62 (brs, 2H, $NH_2$), 7.05-8.03 (m, 12H, ArH), 9.04 (d, J=7.8 Hz, 1H, ArH).

1-3. Synthesis of Triazo Compound 2.0 g (4.0 mmol) of 4-((4-((4-aminonaphthalen-1-yl)diazenyl)-2-(octyloxy)phenyl)diazenyl)benzonitrile represented by Chemical Formula 1a-2 is dissolved in 200 mL of dimethyl acetamide (DMAc) and 50 mL of acetic acid (AcOH), 1.0 mL of 12 N HCl is added thereto, and the mixture is maintained at 0° C. Subsequently, 276 mg (4.0 mmol) of sodium nitrate ($NaNO_2$) is dissolved in water, and the solution is slowly dropwise added to the reaction mixture. When the dropwise addition is complete, the reactant is agitated for one hour while being maintained at 0° C. Then, 700 mg (4.19 mmol) of 2-piperidinothiophene is dissolved in 100 mL of methanol, the solution is slowly dropwise added to the mixture, and the obtained mixture is agitated at 0° C. for one hour. Subsequently, the reactant is neutralized by using a sodium hydroxide (NaOH) aqueous solution to complete the reaction, and a solid precipitated therein is filtered. The mixture is purified through silica gel column chromatography (n-hexane:EtOAc=3:1), obtaining 1.7 g (2.5 mmol) of a dichroic dye (triazo dye) represented by Chemical Formula 1a. A yield is 62%.

The structure of the dichroic dye represented by Chemical Formula 1a is analyzed by $^1$H NMR.

The $^1$H NMR analysis result is as follows.

$^1$H NMR (300 MHz, $CDCl_3$) (ppm): 0.88 (t, J=6.8 Hz, 3H, $CH_3$), 1.23-1.46 (m, 8H, $CH_2\times4$), 1.55-1.59 (m, 2H, $CH_2$), 1.65-1.79 (m, 6H, $CH_2\times3$), 1.96-2.03 (m, 2H, $CH_2$), 3.49-3.54 (m, 4H, $NCH_2\times2$), 4.36 (t, J=6.5 Hz, 2H, $OCH_2$), 6.27 (d, J=4.8 Hz, 1H, ArH), 7.65-8.03 (m, 12H, ArH), 8.93 (d, J=8.8 Hz, 1H, ArH), 9.04 (d, J=8.8 Hz, 1H, ArH).

Synthesis Example 2

Synthesis of Compound Represented by Chemical Formula 1b

Chemical Formula 1b

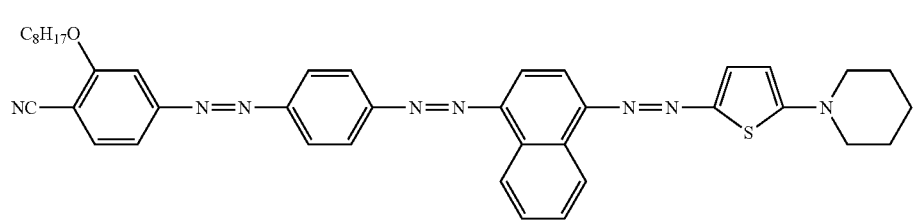

1-1. Synthesis of Monoazo Compound 8.6 g (24.5 mmol) of 4-((4-aminophenyl)diazenyl)-2-(octyloxy)benzonitrile represented by the following Chemical Formula 1b-1 is obtained according to the step 1-1 of Synthesis Example 1, except for using 2-hydroxy-4-((4-nitrophenyl)diazenyl)benzonitrile instead of 4-((2-hydroxy-4-nitrophenyl)diazenyl)benzonitrile. A yield is 66%.

Chemical Formula 1b-1

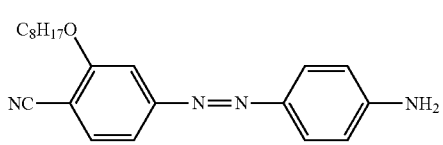

The structure of the 4-((4-aminophenyl)diazenyl)-2-(octyloxy)benzonitrile represented by Chemical Formula 1b-1 is analyzed by $^1$H NMR.

The $^1$H NMR analysis result is as follows.

$^1$H NMR (300 MHz, CDCl$_3$) (ppm): 0.82 (t, J=6.8 Hz, 3H, CH$_3$), 1.19-1.31 (m, 8H, CH$_2$×4), 1.40-1.47 (m, 2H, CH$_2$), 1.77-1.84 (m, 2H, CH$_2$), 4.10 (t, J=6.5 Hz, 2H, OCH$_2$), 4.31 (brs, 2H, NH$_2$), 6.67-7.79 (m, 7H, ArH).

1-2. Synthesis of Bisazo Compound 7.8 g (15.5 mmol) of 4-((4-((4-aminonaphthalen-1-yl)diazenyl)phenyl)diazenyl)-2-(octyloxy)benzonitrile represented by the following Chemical Formula 1b-2 is obtained according to the step 1-2 of Synthesis Example 1, except for using 4-((4-aminophenyl)diazenyl)-2-(octyloxy)benzonitrile instead of 4-((4-amino-2-(octyloxy)phenyl)diazenyl)benzonitrile. A yield is 78%.

Chemical Formula 1b-2

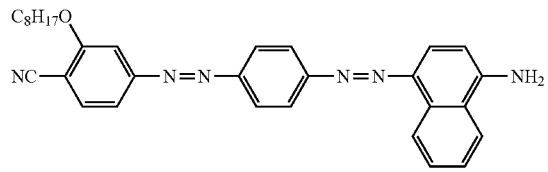

The 4-((4-((4-aminonaphthalen-1-yl)diazenyl)phenyl)diazenyl)-2-(octyloxy)benzonitrile represented by Chemical Formula 1b-2 is analyzed by $^1$H NMR.

The $^1$H NMR analysis result is as follows.

$^1$H NMR (300 MHz, CDCl$_3$) (ppm): 0.83 (t, J=6.7 Hz, 3H, CH$_3$), 1.18-1.41 (m, 8H, CH$_2$×4), 1.47-1.55 (m, 2H, CH$_2$), 1.81-1.88 (m, 2H, CH$_2$), 4.15 (t, J=6.5 Hz, 2H, OCH$_2$), 4.52 (brs, 2H, NH$_2$), 7.13-8.14 (m, 12H, ArH), 8.98 (d, J=7.8 Hz, 1H, ArH).

1-3. Synthesis of Triazo Compound 1.8 g (2.6 mmol) of the dichroic dye represented by Chemical Formula 1b is obtained according to the step 1-3 of Synthesis Example 1, except for using 4-((4-((4-aminonaphthalen-1-yl)diazenyl)phenyl)diazenyl)-2-(octyloxy)benzonitrile instead of 4-((4-((4-aminonaphthalen-1-yl)diazenyl)-2-(octyloxy)phenyl)diazenyl)benzonitrile. A yield is 66%.

The structure of dichroic dye represented by Chemical Formula 1b is analyzed by $^1$H NMR.

The $^1$H NMR analysis result is as follows.

$^1$H NMR (300 MHz, CDCl$_3$) (ppm): 0.83 (t, J=6.7 Hz, 3H, CH$_3$), 1.18-1.41 (m, 8H, CH$_2$×4), 1.47-1.55 (m, 2H, CH$_2$), 1.65-1.72 (m, 6H, CH$_2$×3), 1.81-1.88 (m, 2H, CH$_2$), 3.44-3.48 (m, 4H, NCH$_2$×2), 4.15 (t, J=6.5 Hz, 2H, OCH$_2$), 6.20 (d, J=4.8 Hz, 1H, ArH), 7.43-8.14 (m, 12H, ArH), 8.89 (d, J=8.8 Hz, 1H, ArH), 8.98 (d, J=8.8 Hz, 1H, ArH).

Synthesis Example 3

Synthesis of Compound Represented by Chemical Formula 1c 1-1. Synthesis of Monoazo Compound 9.2 g (25.6 mmol) of 4-((4-chloro-3-(octyloxy)phenyl)diazenyl)aniline represented by the following Chemical Formula 1c-1 is obtained according to the step 1-1 of Synthesis Example 1, except for using 2-chloro-5-((4-nitrophenyl)diazenyl)phenol instead of 4-((2-hydroxy-4-nitrophenyl)diazenyl)benzonitrile. A yield is 69%.

Chemical Formula 1c-1

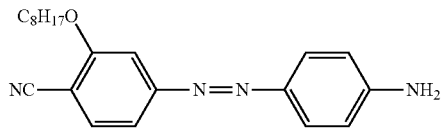

The structure of the 4-((4-((4-chloro-3-(octyloxy)phenyl)diazenyl)phenyl)diazenyl)naphthyl-1-amine represented by Chemical Formula 1c-1 is analyzed by $^1$H NMR.

The $^1$H NMR analysis result is as follows.

$^1$H NMR (300 MHz, CDCl$_3$) (ppm): 0.87 (t, J=6.8 Hz, 3H, CH$_3$), 1.23-1.37 (m, 8H, CH$_2$×4), 1.44-1.51 (m, 2H, CH$_2$), 1.81-1.88 (m, 2H, CH$_2$), 4.14 (t, J=6.5 Hz, 2H, OCH$_2$), 4.18 (brs, 2H, NH$_2$), 6.78-7.86 (m, 7H, ArH).

1-2. Synthesis of Bisazo Compound 7.1 g (13.8 mmol) of 4-((4-((4-chloro-3-(octyloxy)phenyl)diazenyl)phenyl)diazenyl)naphthyl-1-amine represented by the following Chemical Formula 1c-2 is obtained according to the step 1-2 of Synthesis Example 1, except for using 4-((4-((4-chloro-3-(octyloxy)phenyl)diazenyl)phenyl)diazenyl)naphthyl-1-amine instead of 4-((4-amino-2-(octyloxy)phenyl)diazenyl)benzonitrile. A yield is 69%.

Chemical Formula 1c-2

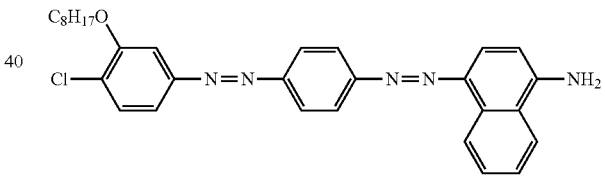

The structure of the 4-((4-((4-chloro-3-(octyloxy)phenyl)diazenyl)phenyl)diazenyl)naphthyl-1-amine represented by Chemical Formula 1c-2 is analyzed by $^1$H NMR.

The $^1$H NMR analysis result is as follows.

$^1$H NMR (300 MHz, CDCl$_3$) (ppm): 0.88 (t, J=6.8 Hz, 3H, CH$_3$), 1.24-1.46 (m, 8H, CH$_2$×4), 1.49-1.56 (m, 2H, CH$_2$), 1.86-1.94 (m, 2H, CH$_2$), 4.14 (t, J=6.5 Hz, 2H, OCH$_2$), 4.32 (brs, 2H, NH$_2$), 7.28-8.01 (m, 12H, ArH), 9.02 (d, J=7.8 Hz, 1H, ArH).

Chemical Formula 1c

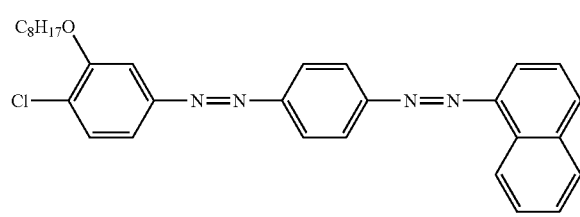
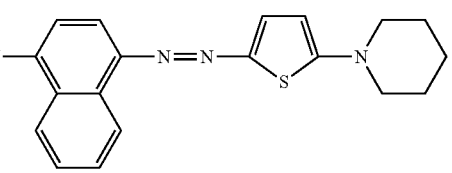

1-3. Synthesis of Triazo Compound 1.5 g (2.2 mmol) of the dichroic dye represented by Chemical Formula 1c is obtained according to the step 1-3 of Synthesis Example 1, except for using 4-((4-((4-chloro-3-(octyloxy)phenyl)diazenyl)phenyl)diazenyl)naphthyl-1-amine instead of 4-((4-((4-aminonaphthalen-1-yl)diazenyl)-2-(octyloxy)phenyl)diazenyl)benzonitrile. A yield is 54%.

The structure of dichroic dye represented by Chemical Formula 1c is analyzed by $^1$H NMR.

The $^1$H NMR analysis result is as follows.

$^1$H NMR (300 MHz, CDCl$_3$) (ppm): 0.88 (t, J=6.8 Hz, 3H, CH$_3$), 1.24-1.46 (m, 8H, CH$_2$×4), 1.49-1.56 (m, 2H, CH$_2$), 1.65-1.79 (m, 6H, CH$_2$×3), 1.86-1.94 (m, 2H, CH$_2$), 3.50-3.54 (m, 4H, NCH$_2$×2), 4.14 (t, J=6.5 Hz, 2H, OCH$_2$), 6.26 (d, J=4.8 Hz, 1H, ArH), 7.68-8.01 (m, 12H, ArH), 8.92 (d, J=8.8 Hz, 1H, ArH), 9.02 (d, J=8.8 Hz, 1H, ArH).

Comparative Synthesis Example 1

Synthesis of Compound Represented by Chemical Formula 1d sented by Chemical Formula 1d-2 is obtained according to the step 1-2 of Synthesis Example 1, except for using 4-((4-amino-2-(octyloxy)phenyl)diazenyl)benzonitrile. A yield is 76%.

Chemical Formula 1d-2

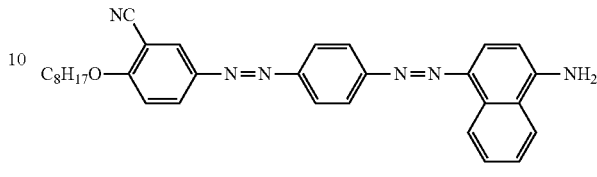

The structure of the 5-((4-((4-aminonaphthalen-1-yl)diazenyl)phenyl)diazenyl)-2-(octyloxy)benzonitrile represented by Chemical Formula 1d-2 is analyzed by $^1$H NMR.

The $^1$H NMR analysis result is as follows.

$^1$H NMR (300 MHz, CDCl$_3$) (ppm): 0.90 (t, J=6.8 Hz, 3H, CH$_3$), 1.25-1.37 (m, 8H, CH$_2$×4), 1.48-1.57 (m, 2H, CH$_2$), Chemical Formula 1d

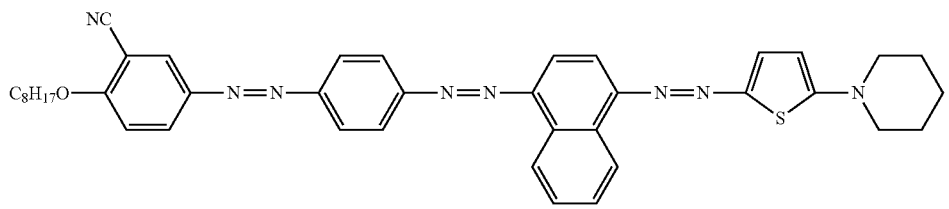

1-1. Synthesis of Monoazo Compound 8.4 g (24.0 mmol) of 5-((4-aminophenyl)diazenyl)-2-(octyloxy)benzonitrile represented by the following Chemical Formula 1d-1 is obtained according to the step 1-1 of Synthesis Example 1, except for using 2-hydroxy-5-((4-nitrophenyl)diazenyl)benzonitrile instead of 4-((2-hydroxy-4-nitrophenyl)diazenyl)benzonitrile. A yield is 64%.

Chemical Formula 1d-1

NC
C$_8$H$_{17}$O—⌬—N=N—⌬—NH$_2$

The structure of the 5-((4-aminophenyl)diazenyl)-2-(octyloxy)benzonitrile represented by Chemical Formula 1d-1 is analyzed by $^1$H NMR.

The $^1$H NMR analysis result is as follows.

$^1$H NMR (300 MHz, CDCl$_3$) (ppm): 0.89 (t, J=6.8 Hz, 3H, CH$_3$), 1.26-1.36 (m, 8H, CH$_2$×4), 1.48-1.58 (m, 2H, CH$_2$), 1.85-1.90 (m, 2H, CH$_2$), 4.09 (brs, 2H, NH$_2$), 4.13 (t, J=6.5 Hz, 2H, OCH$_2$), 6.72-8.09 (m, 7H, ArH).

1-2. Synthesis of Bisazo Compound 7.6 g (15.1 mmol) of 5-((4-((4-aminonaphthalen-1-yl)diazenyl)phenyl)diazenyl)-2-(octyloxy)benzonitrile repre- 1.85-1.92 (m, 2H, CH$_2$), 4.15 (t, J=6.5 Hz, 2H, OCH$_2$), 4.72 (brs, 2H, NH$_2$), 6.81-8.21 (m, 12H, ArH), 9.08 (d, J=7.8 Hz, 1H, ArH).

1-3. Synthesis of Triazo Compound 1.9 g (2.8 mmol) of the dichroic dye represented by Chemical Formula 1d is obtained according to the step 1-3 of Synthesis Example 1, except for using 5-((4-((4-aminonaphthalen-1-yl)diazenyl)phenyl)diazenyl)-2-(octyloxy) benzonitrile instead of 4-((4-((4-aminonaphthalen-1-yl) diazenyl)-2-(octyloxy)phenyl)diazenyl)benzonitrile. A yield is 70%.

The structure of dichroic dye represented by Chemical Formula 1d is analyzed by $^1$H NMR.

The $^1$H NMR analysis result is as follows.

$^1$H NMR (300 MHz, CDCl$_3$) (ppm): 0.90 (t, J=6.8 Hz, 3H, CH$_3$), 1.29-1.39 (m, 8H, CH$_2$×4), 1.45-1.55 (m, 2H, CH$_2$), 1.72-1.79 (m, 6H, CH$_2$×3), 1.87-1.94 (m, 2H, CH$_2$), 3.49-3.54 (m, 4H, NCH$_2$×2), 4.18 (t, J=6.5 Hz, 2H, OCH$_2$), 6.26 (d, J=4.8 Hz, 1H, ArH), 7.09 (d, J=9.1 Hz, 1H, ArH), 7.64-8.24 (m, 11H, ArH), 8.94 (d, J=8.8 Hz, 1H, ArH), 9.05 (d, J=8.8 Hz, 1H, ArH).

Comparative Synthesis Example 2

Synthesis of Compound Represented by Chemical Formula 1e

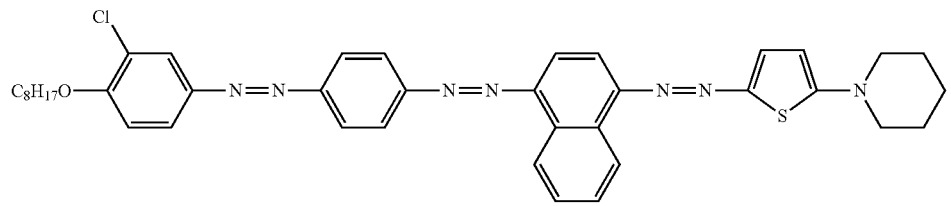

Chemical Formula 1e

1-1. Synthesis of Monoazo Compound 9.1 g (25.3 mmol) of 4-((3-chloro-4-(octyloxy)phenyl)diazenyl)aniline represented by the following Chemical Formula 1e-1 is obtained according to the step 1-1 of Synthesis Example 1, except for using 2-chloro-4-((4-nitrophenyl)diazenyl)phenol instead of 4-((2-hydroxy-4-nitrophenyl)diazenyl)benzonitrile. A yield is 68%.

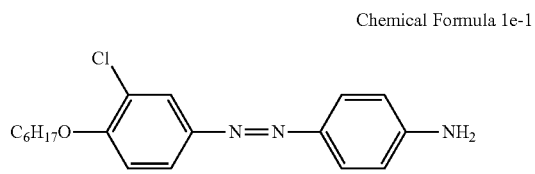

Chemical Formula 1e-1

The structure of the 4-((3-chloro-4-(octyloxy)phenyl)diazenyl)aniline represented by Chemical Formula 1e-1 is analyzed by $^1$H NMR.

The $^1$H NMR analysis result is as follows.

$^1$H NMR (300 MHz, CDCl$_3$) (ppm): 0.87 (t, J=6.8 Hz, 3H, CH$_3$), 1.24-1.33 (m, 8H, CH$_2$×4), 1.45-1.55 (m, 2H, CH$_2$), 1.84-1.90 (m, 2H, CH$_2$), 4.10 (brs, 2H, NH$_2$), 4.15 (t, J=6.5 Hz, 2H, OCH$_2$), 6.75-8.02 (m, 7H, ArH).

1-2. Synthesis of Bisazo Compound 8.1 g (15.8 mmol) of 4-((4-((3-chloro-4-(octyloxy)phenyl)diazenyl)phenyl)diazenyl)naphthyl-1-amine represented by the following Chemical Formula 1e-2 is obtained according to the step 1-2 of Synthesis Example 1, except for using 4-((3-chloro-4-(octyloxy)phenyl)diazenyl)aniline instead of 4-((4-amino-2-(octyloxy)phenyl)diazenyl)benzonitrile. A yield is 79%.

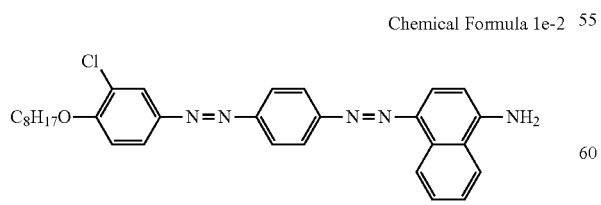

Chemical Formula 1e-2

The structure of the 4-((4-((3-chloro-4-(octyloxy)phenyl)diazenyl)phenyl)diazenyl)naphthyl-1-amine represented by Chemical Formula 1e-2 is analyzed by $^1$H NMR.

The $^1$H NMR analysis result is as follows.

$^1$H NMR (300 MHz, CDCl$_3$) (ppm): 0.90 (t, J=6.8 Hz, 3H, CH$_3$), 1.23-1.38 (m, 8H, CH$_2$×4), 1.52-1.56 (m, 2H, CH$_2$), 1.86-1.93 (m, 2H, CH$_2$), 4.14 (t, J=6.5 Hz, 2H, OCH$_2$), 4.61 (brs, 2H, NH$_2$), 7.05-8.20 (m, 12H, ArH), 9.07 (d, J=7.8 Hz, 1H, ArH).

1-3. Synthesis of Triazo Compound 1.5 g (2.2 mmol) of the dichroic dye represented by Chemical Formula 1e is obtained according to the step 1-3 of Synthesis Example 1, except for using 4-((4-((3-chloro-4-(octyloxy)phenyl)diazenyl)phenyl)diazenyl)naphthyl-1-amine instead of 4-((4-((4-aminonaphthalen-1-yl)diazenyl)-2-(octyloxy)phenyl)diazenyl)benzonitrile. A yield is 54%.

The structure of dichroic dye represented by Chemical Formula 1e is analyzed by $^1$H NMR.

The $^1$H NMR analysis result is as follows.

$^1$H NMR (300 MHz, CDCl$_3$) (ppm): 0.90 (t, J=6.8 Hz, 3H, CH$_3$), 1.23-1.38 (m, 8H, CH$_2$×4), 1.52-1.56 (m, 2H, CH$_2$), 1.72-1.79 (m, 6H, CH$_2$×3), 1.86-1.93 (m, 2H, CH$_2$), 3.48-3.54 (m, 4H, NCH$_2$×2), 4.14 (t, J=6.5 Hz, 2H, OCH$_2$), 6.25 (d, J=4.8 Hz, 1H, ArH), 7.05 (d, J=8.9 Hz, 1H, ArH), 7.65-8.20 (m, 11H, ArH), 8.94 (d, J=8.8 Hz, 1H, ArH), 9.07 (d, J=8.8 Hz, 1H, ArH).

Manufacture of Polarizing Film

Example 1

A composition for a polarizing film is prepared by mixing a polyolefin including polypropylene (PP) and a polypropylene-polyethylene copolymer (PP-PE) in a ratio of 5:5 (w/w) with 0.5 parts by weight of the dichroic dye of Synthesis Example 1 based on 100 parts by weight of the polyolefin.

The composition for a polarizing film is melt-blended at about 250° C. by using a micro-compounder made by DSM. Subsequently, the melt-blended mixture is placed in a sheet-shaped mold and pressed at a high temperature with a high pressure to manufacture a film. Then, the film is 1,000% elongated in a uniaxial direction (with a tensile tester made by Instron) at 125° C. to manufacture a polarizing film.

Example 2

A polarizing film is manufactured according to the same method as Example 1, except for using the dichroic dye according to Synthesis Example 2 instead of the dichroic dye according to Synthesis Example 1.

Example 3

A polarizing film is manufactured according to the same method as Example 1, except for using the dichroic dye according to Synthesis Example 3 instead of the dichroic dye according to Synthesis Example 1.

Comparative Example 1

A polarizing film is manufactured according to the same method as Example 1, except for using the dichroic dye according to Comparative Synthesis Example 1 instead of the dichroic dye according to Synthesis Example 1.

Comparative Example 2

A polarizing film is manufactured according to the same method as Example 1, except for using the dichroic dye according to Comparative Synthesis Example 2 instead of the dichroic dye according to Synthesis Example 1.

Light transmittance, polarizing efficiency, and dichroic ratios in a visible ray region of the polarizing films according to Examples 1 to 3 and Comparative Examples 1 and 2 are evaluated.

The light transmittance is evaluated using V-7100 UV/Vis spectrophotometer (JASCO).

The light transmittance is obtained by respectively measuring light transmittance of a polarizing film of light parallel to a transmittance axis of the polarizing film and light transmittance of the polarizing film of light perpendicular to the transmittance axis of the polarizing film with a UV-VIS spectrophotometer (V-7100, JASCO).

The transmittance is used to calculate a dichroic ratio (DR) and polarizing efficiency (PE).

The dichroic ratio (DR) is obtained according to the following Equation 1.

$$DR = \text{Log}(1/T_\perp)/\text{Log}(1/T_\parallel) \quad \text{Equation 1}$$

In Equation 1,

DR denotes a dichroic ratio, $T_\parallel$ is light transmittance of light entering parallel to the transmissive axis of a polarizing film, and $T_\perp$ is light transmittance of light entering perpendicular to the transmissive axis of the polarizing film.

The polarizing efficiency may be obtained by the following Equation 2.

$$PE (\%) = [(T_\parallel - T_\perp)/(T_\parallel + T_\perp)]^{1/2} \times 100 \quad \text{Equation 2}$$

In Equation 2,

PE denotes polarizing efficiency, $T_\parallel$ is transmittance of light entering parallel to the transmissive axis of a polarizing film, and $T_\perp$ is transmittance of light entering perpendicular to the transmissive axis of the polarizing film.

The results are described referring to FIGS. 4 to 7 and Table 1.

Figure 4:
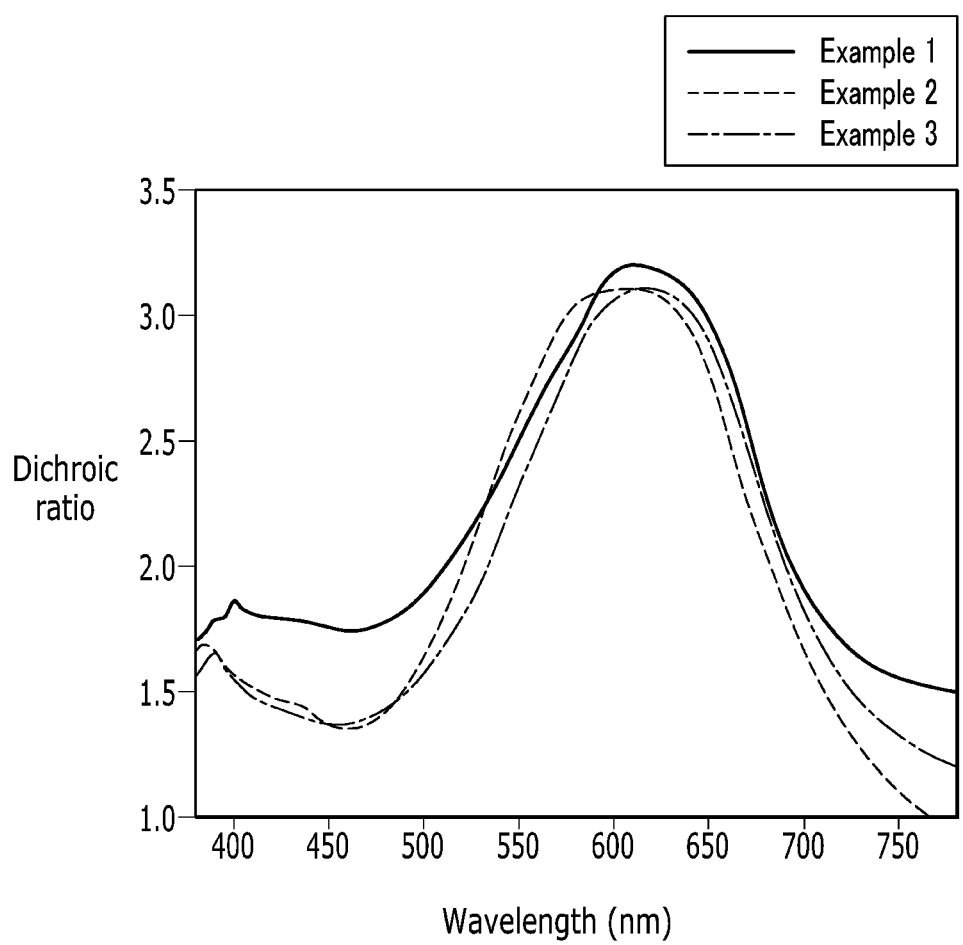
FIG. 4 is a graph of dichroic ratio versus wavelength (nanometers, nm) showing a dichroic ratio of the polarizing films according to Examples 1 to 5 in a visible ray region.
Figure 5:
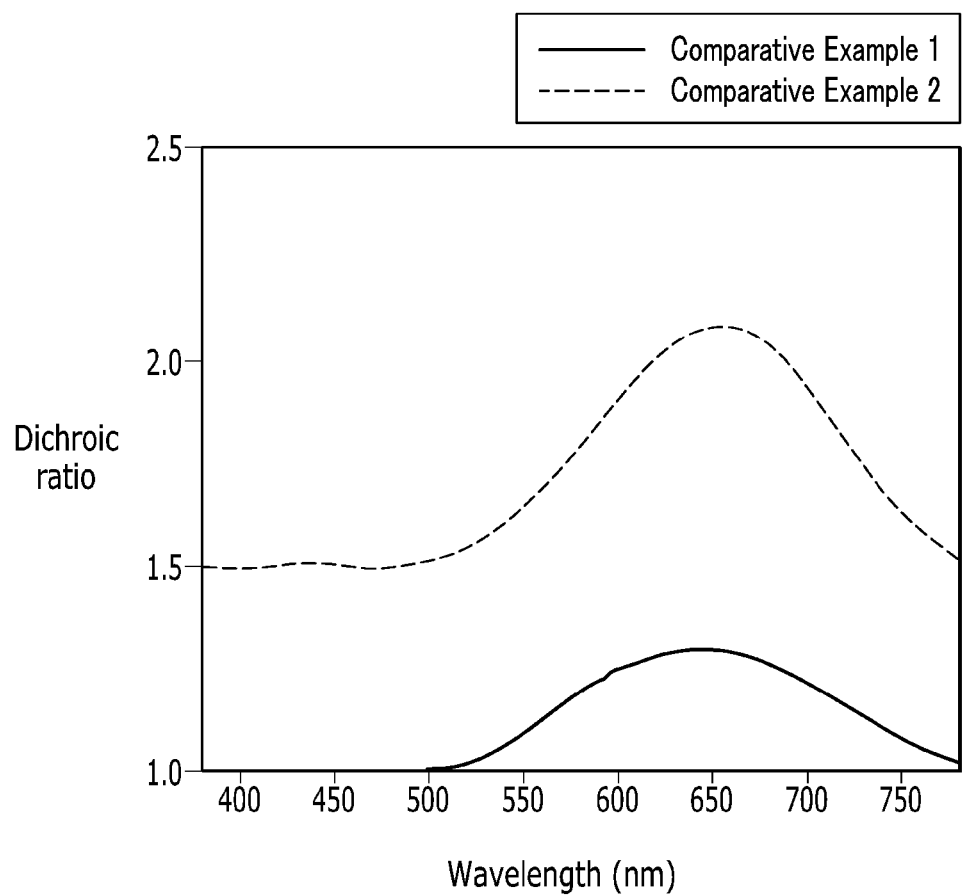
FIG. 5 is a graph of dichroic ratio versus wavelength (nanometers, nm) showing a dichroic ratio of the polarizing films according to Comparative Examples 1 and 2.

FIG. 4 is a graph showing a dichroic ratio of the polarizing films according to Examples 1 to 5 in a visible ray region, and FIG. 5 is a graph showing a dichroic ratio of the polarizing films according to Comparative Examples 1 and 2.

In Table 1, the dichroic ratios of the polarizing films according to Examples 1 to 3 and Comparative Examples 1 and 2 are obtained at a maximum absorption wavelength ($\lambda_{max}$).

TABLE 1

| | $\lambda_{max}$ (nm) | Dichroic ratio (DR) |
|---|---|---|
| Example 1 | 615 | 3.2 |
| Example 2 | 610 | 3.1 |
| Example 3 | 615 | 3.1 |
| Comparative Example 1 | 640 | 1.3 |

TABLE 1-continued

| | $\lambda_{max}$ (nm) | Dichroic ratio (DR) |
|---|---|---|
| Comparative Example 2 | 650 | 2.1 |

Referring to FIG. 4, FIG. 5, and Table 1, the polarizing films according to Examples 1 to 3 show higher dichroic ratios in a wavelength region of greater than or equal to about 600 nm compared with those of Comparative Examples 1 and 2.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A composition for a polarizing film, comprising
a polyolefin and
a dichroic dye represented by Chemical Formula 1:

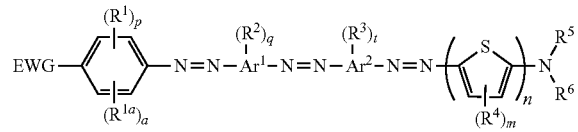

Chemical Formula 1 wherein, in Chemical Formula 1,

EWG is a halogen, C(=O)R, C(=O)OR', a haloalkyl group, C(=O)Cl, CN, SO$_3$R", or NO$_2$, wherein R, R', and R" are a C1 to C30 alkyl group, Ar$^1$ is a C6 to C12 arylene group or a C4 to C12 heteroarylene group, Ar$^2$ is a C12 to C20 arylene group or a C4 to C20 heteroarylene group, R$^1$ and R$^2$ are independently hydrogen, a substituted or unsubstituted C1 to C30 alkyl group, a substituted or unsubstituted C1 to C20 alkoxy group, a substituted or unsubstituted C1 to C20 alkylthio group, a substituted or unsubstituted C2 to C20 alkenyl group, or a substituted or unsubstituted C2 to C20 alkynyl group, provided that at least one of R$^1$ and R$^2$ is a substituted or unsubstituted C1 to C30 alkyl group, a substituted or unsubstituted C1 to C20 alkoxy group, a substituted or unsubstituted C1 to C20 alkylthio group, a substituted or unsubstituted C2 to C20 alkenyl group, or a substituted or unsubstituted C2 to C20 alkynyl group, R$^3$ and R$^4$ are independently hydrogen, a substituted or unsubstituted C1 to C30 alkyl group, a substituted or unsubstituted C1 to C20 alkoxy group, or a substituted or unsubstituted C1 to C20 alkylthio group, m and n are integers of 1 or 2, R$^{1a}$ is hydrogen or a substituted or unsubstituted C1 to C30 alkyl group, provided that R$^1$, R$^{1a}$, and R$^2$ are not simultaneously hydrogen, provided that a+p, q, and r do not exceed bonding valence of the phenylene group, Ar$^1$ and Ar$^2$, respectively, and $R^5$ and $R^6$ are independently hydrogen, a substituted or unsubstituted C1 to C10 alkyl group, wherein $R^5$ and $R^6$ are optionally linked to each other to provide a ring.

2. The composition for a polarizing film of claim 1, wherein the $R^1$ and $R^2$ are a substituted or unsubstituted C5 to C30 alkyl group, a substituted or unsubstituted C5 to C20 alkoxy group, a substituted or unsubstituted C5 to C20 alkylthio group, a substituted or unsubstituted C5 to C20 alkenyl group, or a substituted or unsubstituted C5 to C20 alkynyl group.

3. The composition for a polarizing film of claim 1, wherein $Ar^1$ is a phenylene group or a naphthylene group.

4. The composition for a polarizing film of claim 1, wherein the $Ar^2$ is a naphthylene group or an anthracenylene group.

5. The composition for a polarizing film of claim 1, wherein the dichroic dye is represented by Chemical Formula 2:

Chemical Formula 2

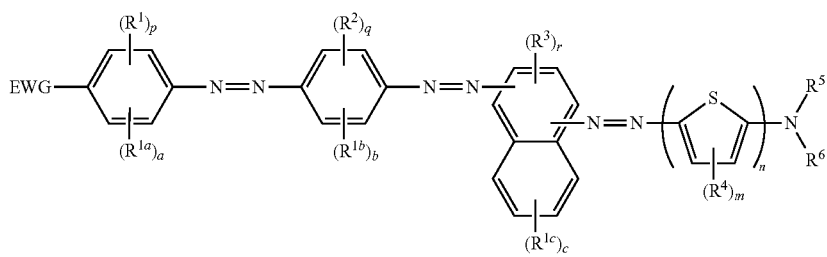

wherein, in Chemical Formula 2,

EWG is a halogen, C(=O)R, C(=O)OR', a haloalkyl group, C(=O)Cl, CN, $SO_3R''$, or $NO_2$, wherein R, R', and R'' are a C1 to C30 alkyl group, $R^1$ and $R^2$ are independently hydrogen, a substituted or unsubstituted C1 to C30 alkyl group, a substituted or unsubstituted C1 to C20 alkoxy group, a substituted or unsubstituted C1 to C20 alkylthio group, a substituted or unsubstituted C2 to C20 alkenyl group, or a substituted or unsubstituted C2 to C20 alkynyl group, provided that at least one of $R^1$ and $R^2$ is a substituted or unsubstituted C1 to C30 alkyl group, a substituted or unsubstituted C1 to C20 alkoxy group, a substituted or unsubstituted C1 to C20 alkylthio group, a substituted or unsubstituted C2 to C20 alkenyl group, or a substituted or unsubstituted C2 to C20 alkynyl group, $R^3$ and $R^4$ are independently hydrogen, a substituted or unsubstituted C1 to C30 alkyl group, a substituted or unsubstituted C1 to C20 alkoxy group, or a substituted or unsubstituted C1 to C20 alkylthio group, m and n are integers of 1 or 2, $R^{1a}$ to $R^{1c}$ are independently hydrogen, or a substituted or unsubstituted C1 to C30 alkyl group, provided that $R^1$, $R^{1a}$, $R^2$, and $R^{1b}$ are not simultaneously hydrogen, p, q, r, a, b, and c are each an integer of 0 to 2, provided that a+p, q+b do not exceed bonding valence of the corresponding phenylene group, and r+c does not exceed bonding valence of the naphthylene group, and $R^5$ and $R^6$ are independently hydrogen, a substituted or unsubstituted C1 to C10 alkyl group, wherein $R^5$ and $R^6$ are optionally linked to each other to provide a ring.

6. The composition for a polarizing film of claim 5, wherein the $R^1$ and $R^2$ are independently a substituted or unsubstituted C5 to C30 alkyl group, a substituted or unsubstituted C5 to C20 alkoxy group, a substituted or unsubstituted C5 to C20 alkylthio group, a substituted or unsubstituted C5 to C20 alkenyl group, or a substituted or unsubstituted C5 to C20 alkynyl group.

7. The composition for a polarizing film of claim 1, wherein the dichroic dye has a decomposition temperature of greater than or equal to about 245° C.

8. The composition for a polarizing film of claim 1, wherein the polyolefin has a melting point of less than or equal to about 300° C.

9. The composition for a polarizing film of claim 1, wherein the polyolefin comprises polyethylene, polypropylene, a copolymer thereof, or a combination thereof.

10. The composition for a polarizing film of claim 1, wherein the polyolefin has a melt flow index of about 1 gram per 10 minutes to about 15 grams per 10 minutes.

11. The composition for a polarizing film of claim 1, wherein the polypropylene has a melt flow index of about 0.1 grams per 10 minutes to 5 grams per 10 minutes, and the polyethylene-polypropylene copolymer has a melt flow index of about 5 grams per 10 minutes to about 15 grams per 10 minutes.

12. The composition for a polarizing film of claim 1, wherein the polyolefin is a mixture of polypropylene and a polyethylene-polypropylene copolymer, and the polyethylene-polypropylene copolymer comprises about 1 to about 50 percent by weight of the polyolefin.

13. The composition for a polarizing film of claim 1, wherein the polyolefin comprises polypropylene and a polyethylene-polypropylene copolymer in a weight ratio of about 1:9 to about 9:1.

14. The composition for a polarizing film of claim 1, wherein an amount of the dichroic dye is about 0.01 to about 5 parts by weight based on 100 parts by weight of the polyolefin.

15. The composition for a polarizing film of claim 14, wherein an amount of the dichroic dye is about 0.05 to 1 part by weight based on 100 parts by weight of the polyolefin.

16. The composition for a polarizing film of claim 1, which has a solid content of greater than or equal to about 90 percent by weight.

17. The composition for a polarizing film of claim 1, which does not comprise a solvent.

18. A polarizing film comprising a molten mixture of the composition for a polarizing film of claim 1.

19. The polarizing film of claim 18, which has a dichroic ratio of about 3 to about 10 in a wavelength region of greater than or equal to about 600 nanometers.

20. The polarizing film of claim 18, wherein the dichroic dye is dispersed in the polyolefin, and the polyolefin is elongated in a uniaxial direction at an elongation rate of about 400 to about 1,000%.

21. A display device comprising the polarizing film of claim 18.

* * * * *